US010431644B2

(12) United States Patent
Kim et al.

(10) Patent No.: US 10,431,644 B2
(45) Date of Patent: Oct. 1, 2019

(54) ORGANIC LIGHT-EMITTING DISPLAY APPARATUS AND MANUFACTURING METHOD THEREOF

(71) Applicant: Samsung Display Co., Ltd., Yongin-si, Gyeonggi-do (KR)

(72) Inventors: Yang-Wan Kim, Yongin-si (KR); Won-Kyu Kwak, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 70 days.

(21) Appl. No.: 15/478,164

(22) Filed: Apr. 3, 2017

(65) Prior Publication Data
US 2017/0207291 A1    Jul. 20, 2017

Related U.S. Application Data

(63) Continuation of application No. 14/294,101, filed on Jun. 2, 2014, now Pat. No. 9,614,021.

(30) Foreign Application Priority Data

Jul. 24, 2013 (KR) ........................ 10-2013-0087611

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/0097* (2013.01); *H01L 51/525* (2013.01);
(Continued)

(58) Field of Classification Search
CPC ... H01L 27/32–326; H01L 51/50–5012; H01L 51/525–5287;
(Continued)

(56) References Cited

U.S. PATENT DOCUMENTS 8,237,355 B2    8/2012   Yamazaki
8,617,932 B2   12/2013   Lee et al.
(Continued)

FOREIGN PATENT DOCUMENTS

CN        1825616 A     8/2006
CN      102479926 A     5/2012
(Continued)

OTHER PUBLICATIONS

EPO Search Report dated Mar. 13, 2015, for corresponding European Patent application 14177414.1, (8 pages).

*Primary Examiner* — Cuong B Nguyen
*Assistant Examiner* — Samuel Park
(74) *Attorney, Agent, or Firm* — Lewis Roca Rothgerber Christie LLP

(57) ABSTRACT

An improved organic light-emitting display apparatus prevents damage of wiring due to a mask during the manufacturing process, and a manufacturing method thereof. An organic light-emitting display apparatus includes a display unit formed on a substrate, a pad unit formed at one outer side of the display unit on the substrate, a wiring unit formed as a multilayer structure on the substrate to couple the display unit to the pad unit, a thin film encapsulating layer covering the display unit, and a protrusion unit that does not overlap the uppermost layer of wiring of the multilayered wiring unit.

19 Claims, 9 Drawing Sheets

(51) Int. Cl.
*H01L 51/56* (2006.01)
*H01L 51/00* (2006.01)

(52) U.S. Cl.
CPC ...... *H01L 51/5237* (2013.01); *H01L 51/5256* (2013.01); *H01L 51/56* (2013.01); *H01L 51/0011* (2013.01); *H01L 2227/323* (2013.01); *H01L 2251/5338* (2013.01); *Y02E 10/549* (2013.01); *Y02P 70/521* (2015.11)

(58) Field of Classification Search
CPC . H01L 2227/32–326; H01L 2251/5323–5361; H01L 2924/12044
USPC .. 257/79–103, 40, 59, 72, E51.001, E51.01; 438/99
See application file for complete search history.

(56) References Cited

U.S. PATENT DOCUMENTS

| | | |
|---|---|---|
| 8,637,894 B2 | 1/2014 | Lee et al. |
| 9,076,745 B2 | 7/2015 | Choi et al. |
| 2003/0180474 A1 | 9/2003 | Nishikawa |
| 2003/0183830 A1* | 10/2003 | Yamazaki ........... H01L 27/3258 257/90 |
| 2005/0045882 A1* | 3/2005 | Park ................... H01L 27/3244 257/59 |
| 2006/0123293 A1 | 6/2006 | Kim et al. |
| 2006/0220056 A1* | 10/2006 | Lee .................... H01L 27/3276 257/100 |
| 2007/0159094 A1* | 7/2007 | Oh ...................... H01L 27/3223 313/512 |
| 2008/0224600 A1 | 9/2008 | Im et al. |
| 2008/0283836 A1 | 11/2008 | Lee |
| 2011/0140163 A1* | 6/2011 | Oh ...................... H01L 51/5256 257/100 |
| 2011/0163662 A1 | 7/2011 | Lim et al. |
| 2011/0291117 A1* | 12/2011 | Kwack ................ H01L 51/5246 257/88 |
| 2012/0126258 A1 | 5/2012 | Lee et al. |
| 2012/0281369 A1 | 11/2012 | Chen et al. |
| 2012/0286312 A1 | 11/2012 | Hatano et al. |
| 2013/0049003 A1 | 2/2013 | Choi et al. |

FOREIGN PATENT DOCUMENTS

| | | |
|---|---|---|
| CN | 102487071 A | 6/2012 |
| CN | 102969456 A | 3/2013 |
| JP | 2011-222146 | 11/2011 |
| KR | 2003-0071651 | 9/2003 |
| KR | 10-2007-0050763 | 5/2007 |
| KR | 10-2008-0048235 | 6/2008 |
| KR | 10-2011-0107045 | 9/2011 |

* cited by examiner

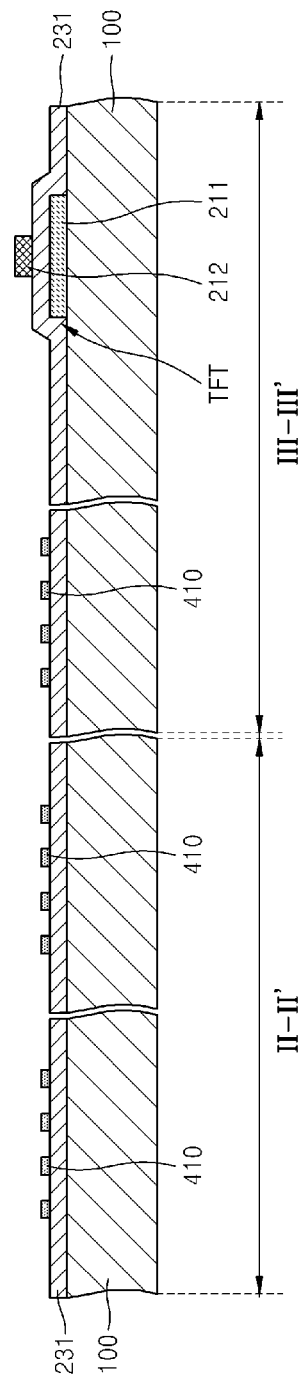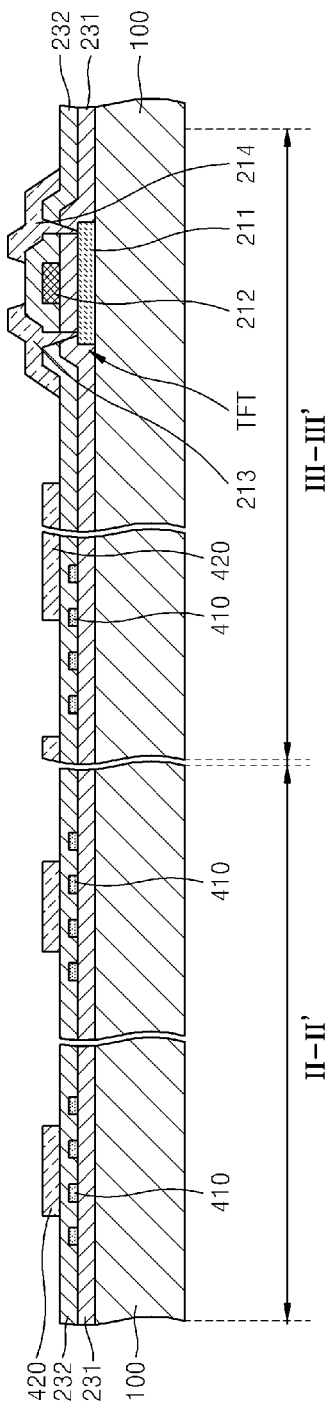

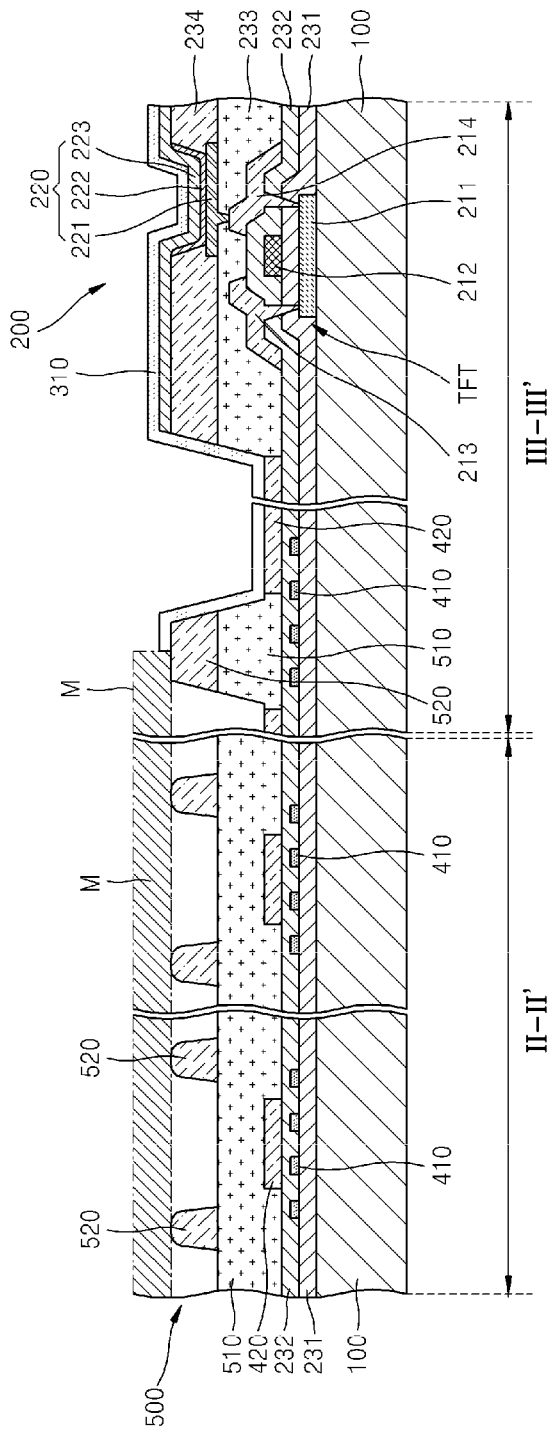

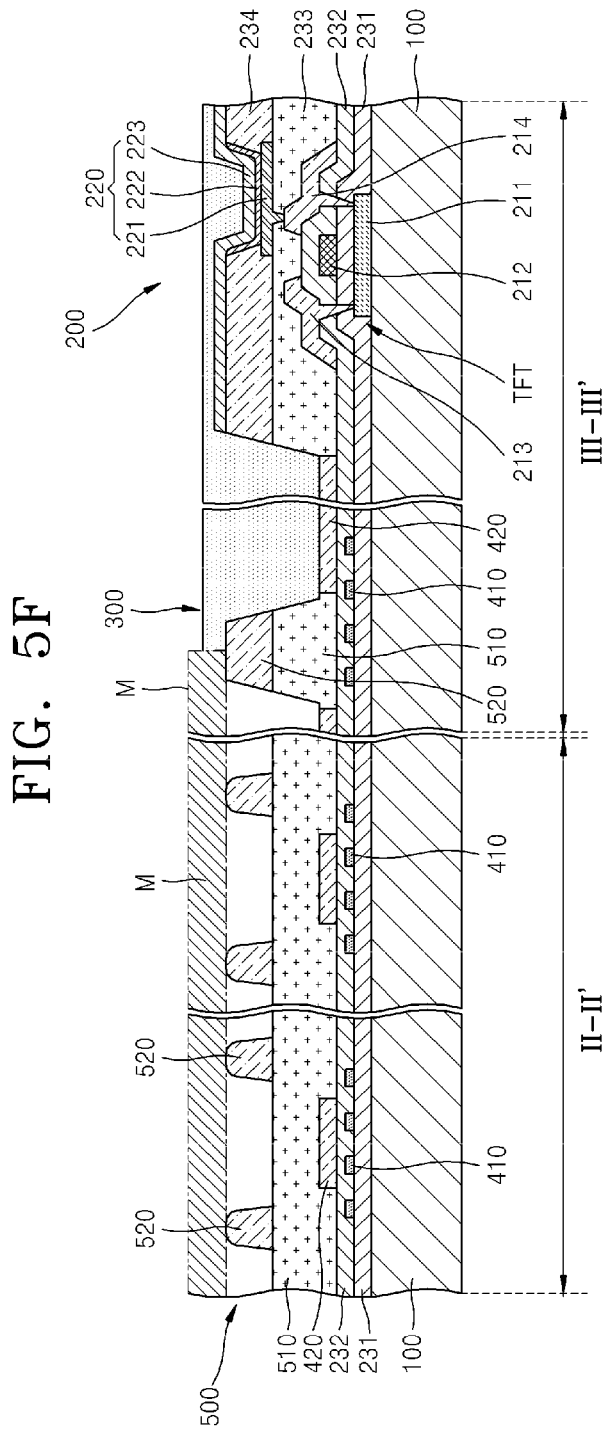

ORGANIC LIGHT-EMITTING DISPLAY APPARATUS AND MANUFACTURING METHOD THEREOF

CROSS-REFERENCE TO RELATED APPLICATION

This application is a continuation of U.S. patent application Ser. No. 14/294,101, filed Jun. 2, 2014, which claims priority to and the benefit of Korean Patent Application No. 10-2013-0087611, filed Jul. 24, 2013, the entire content of both of which is incorporated herein by reference.

BACKGROUND

1. Field

One or more embodiments of the present invention relate to an organic light-emitting display apparatus.

2. Description of the Related Art

In general, organic light-emitting display apparatuses include display units in which a light-emitting layer formed of an organic material between an anode electrode and a cathode electrode is disposed. When voltages are applied respectively to the anode electrode and the cathode electrode, holes injected from the anode electrode and electrons injected from the cathode electrode recombine in the light-emitting layer to generate excitons. When the excitons drop from an excited state to a ground state, light is emitted and an image is formed.

Also, because the light-emitting properties are quickly deteriorated when the light-emitting layer of the display units comes into direct contact with moisture, the light-emitting layer may be covered with an encapsulating layer to prevent the deterioration. For such encapsulating layers, thin film encapsulating layers that are desirable for the flexibility of organic light-emitting display apparatuses are being researched.

When such a thin film encapsulating layer is formed, a deposition process using a mask is performed. Here, wiring formed on a substrate can be damaged by the mask, thereby deteriorating device characteristics.

SUMMARY

Aspects of one or more embodiments of the present invention relate to an organic light-emitting display apparatus, and more particularly, to an improved organic light-emitting display apparatus that reduces the possibility of damage to wiring due to a mask during the manufacturing process, and a manufacturing method thereof.

Additional aspects will be set forth in part in the description which follows and, in part, will be apparent from the description, or may be learned by practice of the presented embodiments.

According to one or more embodiments of the present invention, an organic light-emitting display apparatus includes: a display unit on a substrate; a pad unit at one outer side of the display unit on the substrate; a wiring unit including a plurality of wiring layers on the substrate to couple the display unit to the pad unit, each of the plurality of wiring layers including a plurality of wirings; a thin film encapsulating layer on the display unit; and a protrusion unit that does not overlap the plurality of wirings of an uppermost wiring layer of the wiring unit.

When the thin film encapsulating layer is formed, the protrusion unit is configured to support a mask.

The wiring unit may include: a first wiring layer on the substrate; an insulating layer on the first wiring layer; and a second wiring layer as the uppermost wiring layer on the insulating layer, and the protrusion unit may include a plurality of support protrusions that do not overlap the plurality of wirings of the second wiring layer.

The display unit may include: a thin film transistor that include an active layer, a gate electrode, a source electrode, and a drain electrode that are electrically coupled, and the first wiring layer may include the same material and be at the same layer as the gate electrode, and the second wiring layer may include the same material and be at the same layer as the source electrode and the drain electrode.

The display unit may further include: a pixel electrode coupled to the drain electrode; an opposite electrode facing the pixel electrode; a light-emitting layer between the pixel electrode and the opposite electrode; a planarization layer between the drain electrode and the pixel electrode; and a pixel defining layer partitioning a region of the light-emitting layer between the pixel electrode and the opposite electrode, and the support protrusion may include the same material as the pixel defining layer and is on a same layer as the pixel defining layer.

The protrusion unit may further include a support base on the wiring unit and supporting the support protrusion.

The support base may include the same material and be at the same layer as the planarization layer.

A top surface of the support base facing the support protrusion may be entirely flat.

An additional protruding region may be formed between the support protrusion and the support base.

The thin film encapsulating layer may include at least one inorganic layer and may form a pad unit-side boundary of the inorganic layer on the protrusion unit.

The thin film encapsulating layer may include at least one inorganic layer, and may form a pad unit-side boundary of the inorganic layer closer to the display unit and outside a top surface of the protrusion unit.

The thin film encapsulating layer may include at least one organic layer and at least one inorganic layer that are alternately stacked.

The substrate may include a flexible substrate.

According to one or more embodiments of the present invention, a method for manufacturing an organic light-emitting display apparatus includes: forming a display unit on a substrate; forming a pad unit at one outer side of the display unit on the substrate; forming a wiring unit including a plurality of wiring layers to couple the display unit to the pad unit; forming a protrusion unit that does not overlap wirings of an uppermost layer of the wiring unit; placing a mask on the protrusion unit; and forming a thin film encapsulating layer covering the display unit.

The forming of the wiring unit including a plurality of wiring layers may include: forming a first wiring layer on the substrate; forming an insulating layer on the first wiring layer; and forming a second wiring layer on the insulating layer as the uppermost layer, and the forming of the protrusion unit may include forming a support protrusion for supporting the mask except in a region in which the first wiring layer overlaps the second wiring layer.

The forming of the display unit may include: forming a thin film transistor that includes an active layer, a gate electrode, a source electrode, and a drain electrode that are electrically coupled, and during the forming of the wiring unit, the first wiring layer may be formed of the same material and at the same layer as the gate electrode, and the second wiring layer may be formed of the same material and at the same layer as the source electrode and the drain electrode.

The forming of the display unit may further include: forming a planarization layer on the thin film transistor; forming a pixel electrode coupled to the drain electrode on the planarization layer; forming a pixel defining layer partitioning a region of a light-emitting layer; forming the light-emitting layer on the pixel electrode; and forming an opposite electrode on the light-emitting layer to face the pixel electrode, and during the forming of the protrusion unit, the support protrusion may be formed of the same material as that of the pixel defining layer.

The forming of the protrusion unit may further include forming a support base supporting the support protrusion on the wiring unit.

The support base may be formed of the same material and at the same layer as the planarization layer.

A top surface of the support base facing the support protrusion may be entirely flat.

An additional protruding region may be located between the support protrusion and the support base.

The thin film encapsulating layer may include at least one inorganic layer and may form a pad unit-side boundary of the inorganic layer on the protrusion unit.

The thin film encapsulating layer may include at least one inorganic layer and may form a pad unit-side boundary of the inorganic layer closer to the display unit and outside a top surface of the protrusion unit.

The thin film encapsulating layer may include an alternately stacked organic layer and an inorganic layer.

The substrate may include a flexible substrate.

BRIEF DESCRIPTION OF THE DRAWINGS

These and/or other aspects will become apparent and more readily appreciated from the following description of the embodiments, taken in conjunction with the accompanying drawings of which:

FIGS. 5A to 5F are cross-sectional views sequentially illustrating a process of manufacturing the organic light-emitting display apparatus shown in FIGS. 2 and 3;

DETAILED DESCRIPTION

Figure 1:
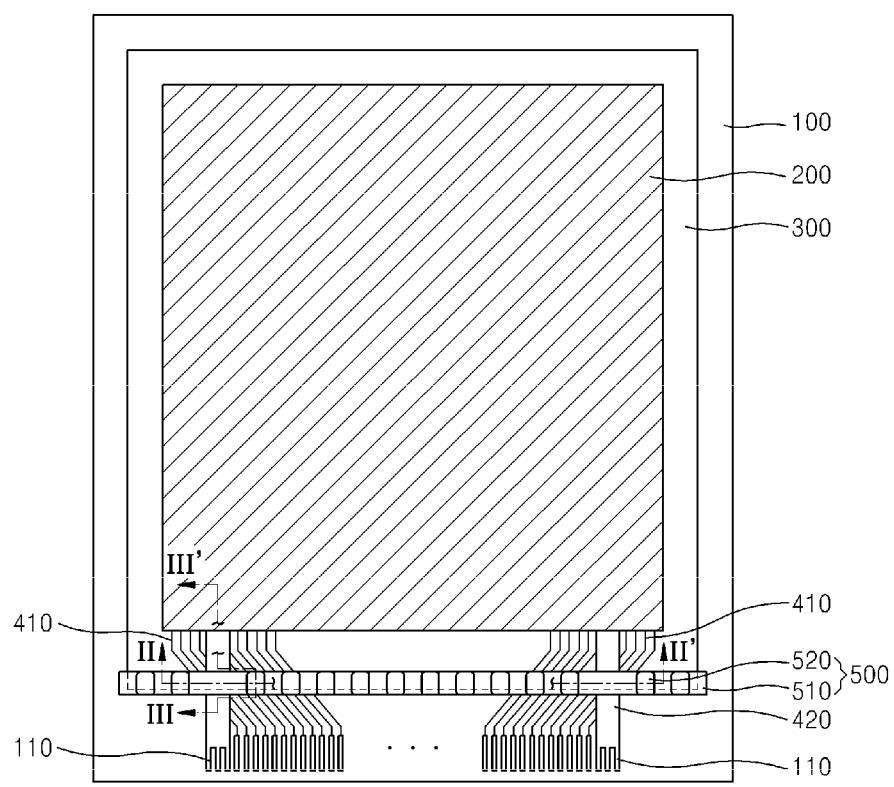
FIG. 1 is a plan view illustrating an organic light-emitting display apparatus according to an embodiment of the present invention.

Reference will now be made in more detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. Further, the use of "may" when describing embodiments of the present invention refers to "one or more embodiments of the present invention."

Example embodiments of the present invention will be described below in more detail with reference to the accompanying drawings.

Like reference numerals refer to like elements throughout. Detailed descriptions of known functions or configurations will not be repeated in order not to unnecessarily obscure the focus of the present invention.

In the drawings, thicknesses of layers or regions may be exaggerated for clarity. Also, it will be understood that when an element, such as a layer, a film, a region, or a plate, is referred to as being 'on', 'connected to' or 'coupled to' another element, it may be directly on, connected or coupled to the other element or intervening elements may be present.

Figure 2:
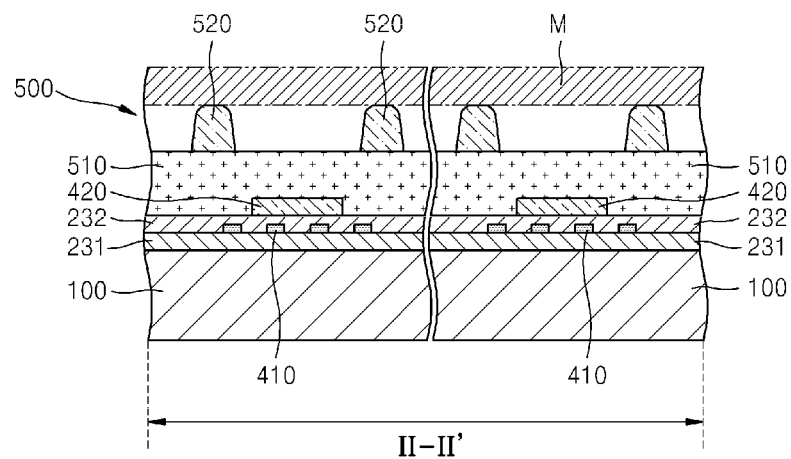
FIG. 2 is a cross-sectional view taken along the line II-II' of FIG. 1.
Figure 3:
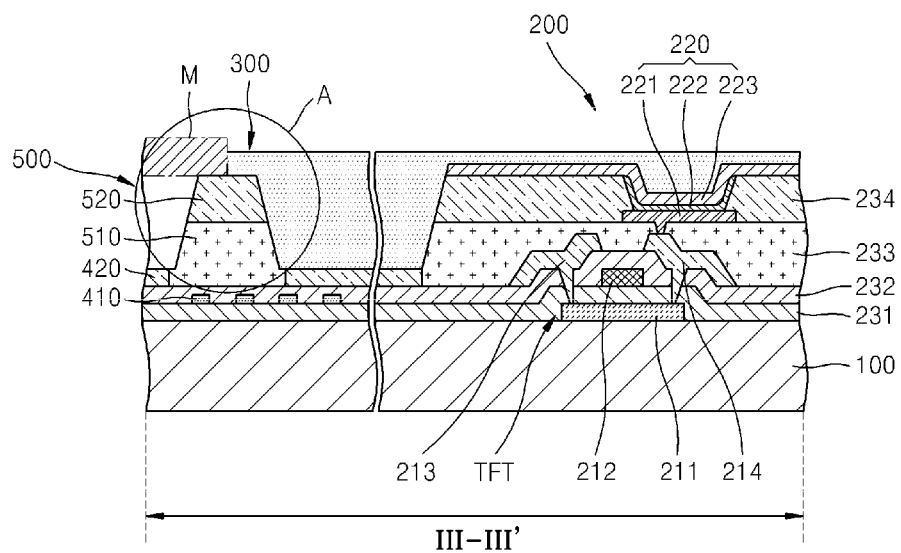
FIG. 3 is a cross-sectional view taken along the line III-III' of FIG. 1.

FIG. 1 is a plan view illustrating an organic light-emitting display apparatus according to an embodiment of the present invention. FIG. 2 is a cross-sectional view taken along the line II-II' of FIG. 1. FIG. 3 is a cross-sectional view taken along the line III-III' of FIG. 1.

Referring to FIGS. 1 to 3, an organic light-emitting display apparatus according to an embodiment of the present invention includes a substrate 100; a display unit 200 disposed on the substrate 100 to display an image; and a thin film encapsulating layer 300 on the display unit 200. The thin film encapsulating layer 300 is covering the display unit 200. Thus, the display unit 200 can be interposed between the substrate 100 and the thin film encapsulating layer 300. The display unit 200 can be safely secured from permeation of moisture. The substrate 100 that is used may be a substrate of a flexible material such as polyimide (PI).

A pad unit 110 for coupling the display unit 200 to a power source is disposed at one outer side (e.g., on one side outside) of the display unit 200 on the substrate 100, and a first wiring layer 400A with a plurality of first wirings 410 and a second wiring layer 400B with a plurality of second wirings 420 are formed as a wiring unit 400 for coupling the pad unit 110 to the display unit 200. The first and second wirings 410 and 420 are formed at different layers with an insulating layer 232 therebetween. Also, a protrusion unit 500 is formed on the wiring unit 400. Since the protrusion unit 500 supports a mask M during a deposition process for forming a thin film encapsulating layer 300, the protrusion unit 500 may serve to suppress or reduce the possibility of damaging the wiring unit 400 by the mask M.

For convenience of explanation, a comparative example has a structure that does not have the protrusion unit 500, unlike the embodiment of the present invention. In this case, as described above, when the mask M is disposed to form the thin film encapsulating layer 300, since the second wiring 420 disposed on the uppermost layer directly contacts the mask M without any protective layer, damages such as scratches may occur. Also, the insulating layer 232 disposed between the first and second wirings 410 and 420 may be broken to cause a short circuit due to the load of the mask M.

However, in the above-described embodiment of the present invention, the protrusion unit 500 supports the mask M to prevent the wiring unit 400 from being damaged. That is, since the protrusion unit 500 is erected to support the mask M so that the second wiring 420 disposed thereabove does not directly contact the mask M, a potential cause of a defect such as a scratch may be averted (e.g., avoided). The protrusion unit 500 includes a support base 510 (e.g., in the form of a strip narrower than the wiring unit 400 along the side of the display unit 200) formed on the wiring unit 400, and a support protrusion 520 formed on the support base 510 to support the mask M. Also, as shown in FIG. 2, the support protrusion 520 may be formed on the wiring unit except in a region in which the first wiring 410 overlaps the second wiring 420. Thus, the possibility of a short circuit occurring between the first and second wirings 410 and 420 due to the load of the mask M may be effectively reduced. That is, when the mask M is disposed, the load is mostly applied at the point where the support protrusion 520 is, which directly supports the mask M. Thus, if the first and second wirings 410 and 420 overlap below the support protrusion 520, the insulating layer 232 may be broken and the possibility of a short circuit may increase. However, as in the structure described above, when the support protrusion 520 is formed on the wiring unit 400 except in the region in which the first wiring 410 overlaps the second wiring 420, even if a portion of the insulating layer 232 is damaged by the load, since the first and second wirings 410 and 420 do not overlap in the region where the insulating layer 232 is damaged by the load, contact between the first and second wirings 410 and 420 may be prevented or reduced, the occurrence of a failure such as a short circuit may be effectively suppressed or reduced.

Also, the first wiring 410 may be coupled to the pad unit 110 through a contact hole. The second wiring 420 may be disposed flush with the pad unit 110. Here, the second wiring 420 may extend to be a portion of the pad unit 110. Also, the second wiring 420 may be coupled to the pad unit 110 by the other elements.

As shown in FIG. 3, the first and second wirings 410 and 420, and the protrusion unit 500 may be formed during a process when a thin film transistor TFT of the display unit 200 and a pixel 220 are formed. That is, they are not formed by a separate additional process, but are formed together when the display unit 200 is formed.

Referring to FIG. 3, the structure of the display unit 200 will be described schematically. The TFT may include an active layer 211, a gate electrode 212, a source electrode 213, and a drain electrode 214. A gate insulating layer 231 may be disposed between the gate electrode 212 and the active layer 211. Also, source and drain regions into which high density impurities are injected may be formed on both edges of the active layer 211, and may be respectively coupled to the source and drain electrodes 213 and 214. Thus, when an appropriate voltage is applied to the gate electrode 212, an area between the source region and the drain region of the active layer 211 serves as a channel to allow current to flow from the source electrode 213 to the drain electrode 214.

The pixel 220 may include a pixel electrode 221 coupled to the drain electrode 214 of the TFT, an opposite electrode 223 serving as a cathode, and a light-emitting layer 222 disposed between the pixel electrode 221 and the opposite electrode 223. Reference numeral '233' denotes a planarization layer and '234' denotes a pixel defining layer that partitions a pixel region.

Also, the positional relationship between the wiring unit 400 and the protrusion unit 500 may be as described below. The wiring unit 400 may include a first wiring layer including a plurality of first wirings 410 formed on the substrate 100, an insulating layer 232 formed on the first wirings 410, and a second wiring layer including a plurality of second wirings 420 formed on the insulating layer 232. Thus, the first wirings 410 and the second wirings 420 are separated by the insulating layer 232. A portion of the first wirings 410 overlap the second wirings 420 in the plan view in FIG. 1. The support base 510 of the protrusion unit 500 crosses the first and second wirings 410 and 420 above the wiring unit 400, and the support protrusion 520 does not overlap the second wirings 420 that is the uppermost layer. That is, the region where the second wirings 420 do not overlap the first wirings 410 represents a region in which the support protrusion 520 is formed, but not in the region in which the first wirings 410 overlap the second wirings 420, as described above. That is, when the mask M is disposed, a load is mostly applied at the point of the support protrusion 520 which directly supports the mask M. Since the support protrusion 520 is not formed in the region in which the first wirings 410 overlap the second wirings 420, even if a portion of the insulating layer 232 is damaged by the load, contact between the first wirings 410 and the second wirings 420 may be reduced or prevented.

Hereinafter, a process of manufacturing the organic light-emitting display apparatus having such a structure will be described.

First, as shown in FIG. 5A, the active layer 211 of the TFT of the display unit 200, the gate insulating layer 231, and the gate electrode 212 are sequentially formed on the substrate 100. Here, high density impurities are injected in both edges of the active layer 211 to form the source and drain regions, and the source and drain electrodes 213 and 214 may be respectively coupled thereto. A channel region is formed in a central portion of the active layer 211 which is between the source region and the drain region. Also, when the gate electrode 212 is formed, the first wiring 410 of the wiring unit 400 is formed of the same material and on the same layer as the gate electrode 212.

Thereafter, as shown in FIG. 5B, the insulating layer 232 is formed again, and then the source electrode 213 and the drain electrode 214 of the TFT are formed on the insulating layer 232. Here, a contact hole is formed (defined) in the gate insulating layer 231 and the insulating layer 232 to couple the source electrode 213 to the source region of the active layer 211 and couple the drain electrode 214 to the drain region of the active layer 211, respectively. Also, the second wiring 420 of the wiring unit 400 is formed of the same material and on the same layer as the source electrode 213 and the drain electrode 214.

Figure 5C:
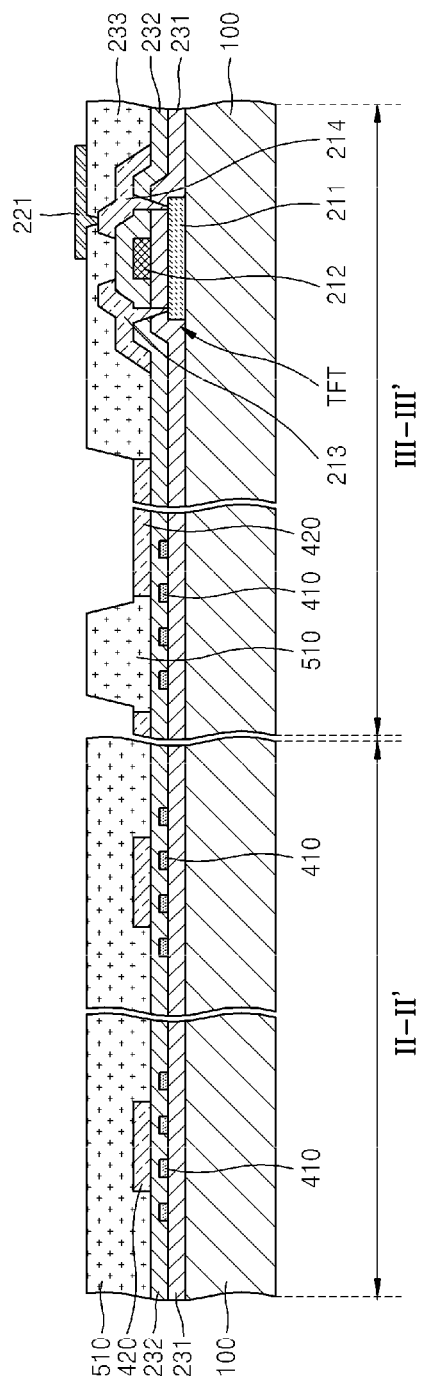

Thereafter, as shown in FIG. 5C, a planarization layer 233 is formed on the display unit 200, and the pixel electrode 221 of the pixel 220 is formed on the planarization layer 233. Here, the support base 510 of the protrusion unit 500 is formed of the same material and on the same layer as the planarization layer 233 when the planarization layer 233 is formed.

Figure 5D:
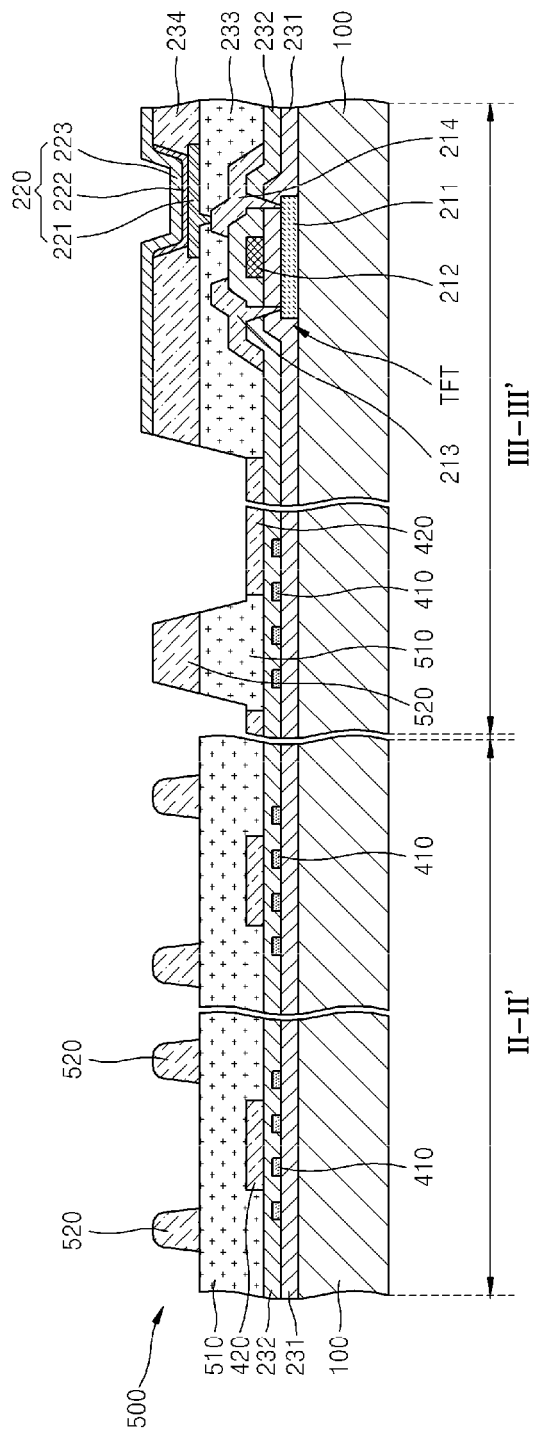

Also, as shown in FIG. 5D, a pixel defining layer 234 of the pixel 220, the light-emitting layer 222, and an opposite electrode 223 are sequentially formed, and here, the support protrusion 520 of the protrusion unit 500 is formed of the same material and on the same layer as the pixel define layer 234 when the pixel define layer 234 is formed, Here, the support protrusion 520 as described above may be formed on the wiring unit 400 except in the region in which the first wiring 410 overlaps the second wiring 420.

Next, an inorganic layer 310 of the thin film encapsulating layer 300 for covering the display unit 200 is formed. Here, a mask M for forming the thin film encapsulating layer 300 is seated (or placed) on the support protrusion 520 as shown in FIG. 5E. By doing so, since the mask M does not directly contact the wiring units 410 and 420, damage of the wirings 410 and 420 due to the mask M may be prevented or reduced when the inorganic layer 310 is formed. Also, as described above, since the support protrusion 520 is formed on the wiring unit 400 except in the region in which the first wiring 410 overlaps the second wiring 420, even if the insulating layer 232 disposed below the support protrusion 520 is damaged by the load of the mask M, a short circuit due to contact between the first and second wirings 410 and 420 may be reduced or suppressed. Thereafter, an organic layer and an inorganic layer are alternately stacked again on the inorganic layer 310 to complete the thin film encapsulating layer 300 as shown in FIG. 5F. An example of the stacked structure of the thin film encapsulating layer 300 will be described below in more detail.

Figure 4A:
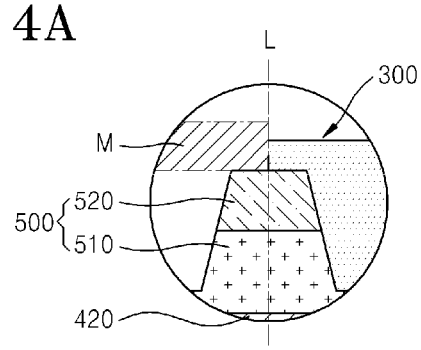
FIG. 4A is an enlarge view of area A of FIG. 3.
Figure 4B:
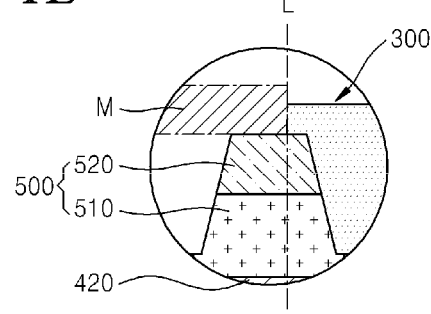
FIGS. 4B to 4D are schematic views illustrating various positions of the boundary line shown in FIG. 4A.
Figure 4C:
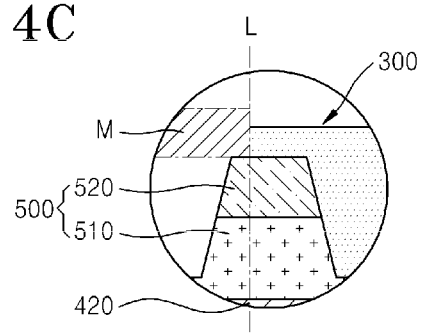
Figure 4D:
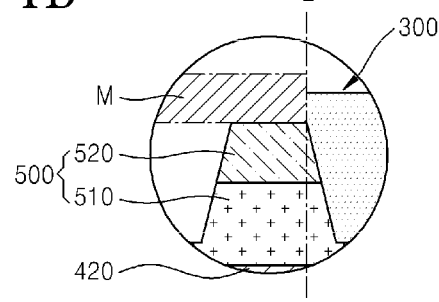

When the thin film encapsulating layer 300 is formed, since the mask M is disposed on the support protrusion 520, a boundary of the thin film encapsulating layer 300 on the pad unit-side deposited through an opening of the mask M is formed on the protrusion unit 500. According to an embodiment of the present invention, as shown in FIG. 4A, the pad unit-side boundary L of the thin film encapsulating layer 300 is formed at a central position of the protrusion unit 500. The boundary L may be alternatively formed a bit closer to the display unit 200, as shown in FIG. 4B. Conversely, the boundary L may be formed a bit closer to the pad unit 110, as shown in FIG. 4C. As shown in FIG. 4D, the mask M is disposed to cover an entire top surface of the protrusion unit 500 so that the boundary L may be formed closer to the display unit 200 outside the upper surface of the protrusion unit 500.

As described above, the thin film encapsulating layer 300 may be formed of the inorganic layer 310 having a single layer or a multilayered structure, and may have a multilayered structure in which at least one inorganic layer 310 and at least one organic layer are alternately stacked. The inorganic layer 310 may have a boundary L using the mask M, and the organic layer may have a different boundary from the inorganic layer 310 by using a different mask for the organic layer.

For example, the thin film encapsulating layer 300 may be formed as a single layer or a multilayered structure including metal oxide or metal nitride. In more detail, the inorganic layer may include at least one of SiNx, $Al_2O_3$, $SiO_2$, or $TiO_2$. The uppermost layer of the thin film encapsulating layer 300 that is exposed to the outside may be formed as an inorganic layer to prevent or reduce moisture permeation into the display unit 200. Also, the thin film encapsulating layer 300 may include at least one sandwich structure in which at least one organic layer is inserted between at least two inorganic layers. Additionally, the thin film encapsulating layer 300 may include at least one sandwich structure in which at least one inorganic layer is inserted between at least two organic layers. The thin film encapsulating layer 300 may include a first inorganic layer, a first organic layer, and a second inorganic layer, which are sequentially stacked on the display unit 200. Also, the thin film encapsulating layer 300 may include a first inorganic layer, a first organic layer, a second inorganic layer, a second organic layer, and a third inorganic layer, which are sequentially stacked on the display unit 200. Also, the thin film encapsulating layer 300 may include a first inorganic layer, a first organic layer, a second inorganic layer, a second organic layer, a third inorganic layer, a third organic layer, and a fourth inorganic layer, which are sequentially stacked on the display unit 200. A halogenated metal layer including LiF may be additionally included between the display unit 200 and the first inorganic layer. The halogenated metal layer may prevent the display unit 200 from being damaged when the first inorganic layer is formed through a sputtering method or a plasma deposition method. The first organic layer may have a narrower area than the second inorganic layer, and the second organic layer may have a narrower area than the third inorganic layer. Additionally, the first organic layer may be completely covered by the second inorganic layer. The second organic layer may be completely covered by the third inorganic layer.

The organic layer may be formed of suitable polymer materials, and may be one of polyethylene terephthalate, polyimide, polycarbonate, epoxy, polyethylene, and polyacrylate. In one embodiment, the organic layer is formed of polyacrylate. In more detail, the organic layer may include a polymerized monomer composition including diacrylate-based monomer and triacrylate-based monomer. The monomer composition may further include monoacrylate-based monomer. Moreover, the monomer composition may further include a suitable photo initiator such as TPO but is not limited thereto.

Thus, the thin film encapsulating layer 300 may be provided in various forms, and the mask M used here may be seated on the protrusion unit 500 to be safely used without damaging the wiring units 410 and 420.

Figure 6:
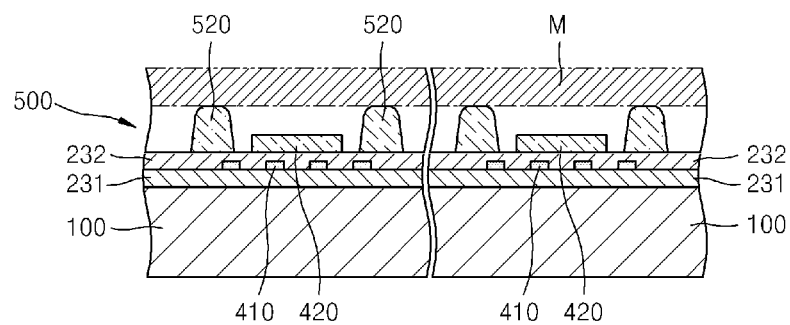
FIG. 6 is a cross-sectional view illustrating an organic light-emitting display apparatus according to another embodiment of the present invention.

Hereinafter, examples of possible modifications from the basic structure will be described. Referring to FIG. 6, the support protrusion 520 may be formed on the same layer as that of the second wiring 420. Here, the support protrusion 520 is formed on the insulating layer 232 except in the region in which the first wiring 410 overlaps the second wiring 420.

Figure 7:
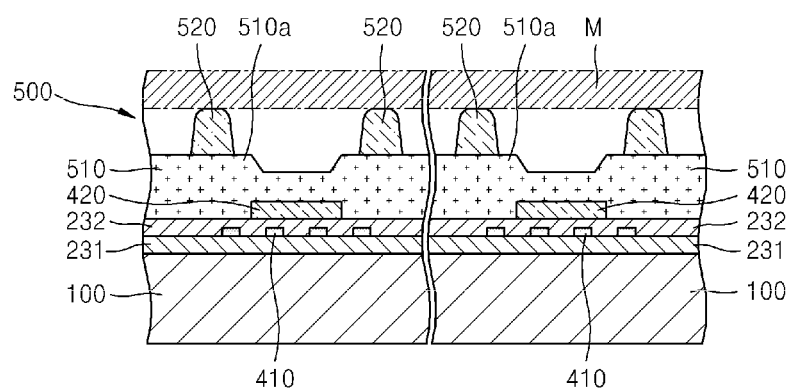
FIG. 7 is a cross-sectional view illustrating an organic light-emitting display apparatus according to another embodiment of the present invention.

Also, as shown in FIG. 7, other examples will now be described. Like the forgoing embodiments, the protrusion unit 500 includes the support base 510 and the support protrusion 520. The support base 510 may further include a protruding region 510a (e.g., in areas where the first and second wirings do not overlap). Also, the support protrusion 520 may be disposed on the protruding region 510a of the support base 510. Thus, a distance between the support protrusion 520 and the first and second wirings 410 and 420 may be further increased. Even though the surface of the support base 510 may be flat as in the above-described embodiments, the surface of the support base 510 may be changed to a shape to further include the protruding region 510a (e.g., in areas where the first and second wirings do not overlap). Likewise, the structure may be altered in various ways.

According to the organic light-emitting display apparatus and the manufacturing method thereof as discussed above, damage to the wiring due to the mask may be effectively reduced or prevented. Thus, the product defect rate may be significantly reduced.

Although the present invention has been described with reference to the example embodiments illustrated in the drawings, it should be understood that numerous other modifications and embodiments can be devised by those skilled in the art. Hence, the protective scope of the present invention shall be determined by the spirit and scope of the following claims, and equivalents thereof.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
   a display unit on a substrate, the display unit comprising a thin film transistor comprising an active layer, a gate electrode, a source electrode, and a drain electrode that are electrically coupled;
   a pad unit at one outer side of the display unit on the substrate; a wiring unit comprising a plurality of wiring layers on the substrate to couple the display unit to the pad unit, each of the plurality of wiring layers comprising a plurality of wirings;
   a thin film encapsulating layer covering the display unit, the thin film encapsulating layer comprising a stacked structure of a first inorganic layer, a first organic layer and a second inorganic layer, the first organic layer being between the first and second inorganic layers; and
   a protrusion unit on the wiring unit, the protrusion unit overlapping a boundary of the thin film encapsulating layer,
   wherein the protrusion unit is spaced apart from the gate electrode, the source electrode and the drain electrode of the thin film transistor,
   the protrusion unit overlays with at least one of a boundary of the first inorganic layer and a boundary of the second inorganic layer of the thin film encapsulating layer, and
   a portion of the thin film encapsulating layer is between the protrusion unit and the display unit,
   wherein the protrusion unit comprises a plurality of support protrusions and a support base supporting the plurality of support protrusions, the display unit further comprises: a pixel electrode coupled to the drain electrode; an opposite electrode facing the pixel electrode;
   a light-emitting layer between the pixel electrode and the opposite electrode; a planarization layer between the drain electrode and the pixel electrode; and a pixel defining layer partitioning a region of the light-emitting layer between the pixel electrode and the opposite electrode,
   wherein the support base comprises a same material and is on a same layer as the planarization layer, and
   the support protrusion comprises a same material and is on a same layer as the pixel defining layer.

2. The organic light-emitting display apparatus of claim 1, wherein the plurality of wirings of the plurality of wiring layers extending along a first direction between the display unit and the pad unit, the protrusion unit extending along a second direction crossing the first direction, wherein the protrusion unit is longer in length along the second direction than the thin film encapsulating layer.

3. The organic light-emitting display apparatus of claim 1, wherein the protrusion unit is rectangular shape in a plan view.

4. The organic light-emitting display apparatus of claim 1, wherein the plurality of wirings of an uppermost wiring layer are disposed among the plurality of support protrusions.

5. The organic light-emitting display apparatus of claim 4, wherein the plurality of support protrusions do not overlap the plurality of wirings of the uppermost wiring layer of the wiring unit.

6. The organic light-emitting display apparatus of claim 4, wherein the wiring unit comprises: a first wiring layer on the substrate; an insulating layer on the first wiring layer; and a second wiring layer as the uppermost wiring layer on the insulating layer.

7. The organic light-emitting display apparatus of claim 4, wherein each of the plurality of support protrusions overlaps with the boundary of the thin film encapsulating layer.

8. The organic light-emitting display apparatus of claim 7, wherein each of the plurality of support protrusions is rectangular shape in a plan view including a couple of long side along a first direction between the display unit and the pad unit and a couple of short side shorter than the long side along a second direction crossing the first direction, and wherein the boundary of the thin film encapsulating layer cross on the plurality of support protrusions along the second direction.

9. The organic light-emitting display apparatus of claim 1, wherein the thin film encapsulating layer comprises at least one inorganic layer.

10. The organic light-emitting display apparatus of claim 9, wherein the thin film encapsulating layer further comprises at least one organic layer, and wherein the organic layer and the inorganic layer are alternately stacked.

11. A method for manufacturing an organic light-emitting display apparatus, the method comprising:
   forming a display unit on a substrate, the display unit comprising a thin film transistor comprising an active layer, a gate electrode, a source electrode, and a drain electrode that are electrically coupled;
   forming a pad unit at one outer side of the display unit on the substrate;
   forming a wiring unit comprising a plurality of wiring layers to couple the display unit to the pad unit, each of the plurality of wiring layers comprising a plurality of wirings;
   forming a protrusion unit on the wiring unit;
   placing a mask on the protrusion unit; and
   forming a thin film encapsulating layer covering the display unit, wherein the protrusion unit overlaps with a boundary of the thin film encapsulating layer, the thin film encapsulating layer comprising a stacked structure of a first inorganic layer, a first organic layer and a second inorganic layer, the first organic layer being between the first and second inorganic layers,
   wherein the protrusion unit is spaced apart from the gate electrode, the source electrode and the drain electrode of the thin film transistor,
   the protrusion unit overlays with at least one of a boundary of the first inorganic layer and a boundary of the second inorganic layer of the thin film encapsulating layer, and
   a portion of the thin film encapsulating layer is between the protrusion unit and the display unit,
   wherein the protrusion unit comprises a plurality of support protrusions and a support base supporting the plurality of support protrusions, the display unit further comprises: a pixel electrode coupled to the drain electrode; an opposite electrode facing the pixel electrode;
   a light-emitting layer between the pixel electrode and the opposite electrode; a planarization layer between the drain electrode and the pixel electrode; and a pixel defining layer partitioning a region of the light-emitting layer between the pixel electrode and the opposite electrode, wherein the support base comprises a same material and is on a same layer as the planarization layer, and the support protrusion comprises a same material and is on a same layer as the pixel defining layer.

12. The method of claim 11, wherein the plurality of wirings of the plurality of wiring layers extending along a first direction between the display unit and the pad unit, the protrusion unit extending along a second direction crossing the first direction, wherein the protrusion unit is longer in length along the second direction than that of the thin film encapsulating layer.

13. The method of claim 11, wherein the protrusion unit is rectangular shape in a plan view.

14. The method of claim 11, wherein the plurality of wirings of an uppermost wiring layer are disposed among the plurality of support protrusions.

15. The method of claim 14, wherein the plurality of support protrusions do not overlap the plurality of wirings of the uppermost wiring layer of the wiring unit.

16. The method of claim 14, wherein the forming of the wiring unit comprises:

forming a first wiring layer on the substrate;

forming an insulating layer on the first wiring layer; and forming a second wiring layer as the uppermost wiring layer on the insulating layer.

17. An organic light-emitting display apparatus comprising:

a display unit on a substrate;

a pad unit at one outer side of the display unit on the substrate; a wiring unit to couple the display unit to the pad unit;

a thin film encapsulating layer covering the display unit, the thin film encapsulating layer comprising a stacked structure of a first inorganic layer, a first organic layer and a second inorganic layer, the first organic layer being between the first and second inorganic layers; and a protrusion unit on the wiring unit, overlapping a boundary of the thin film encapsulating layer, wherein the protrusion unit comprises a plurality of support protrusions and a support base supporting the support protrusions, the wiring unit comprises a first wiring layer on the substrate, an insulating layer on the first wiring layer and a second wiring layer on the insulating layer, wherein the support protrusions overlap with the first wiring layer and do not overlap the second wiring layer, the protrusion unit overlays with at least one of a boundary of the first inorganic layer and a boundary of the second inorganic layer of the thin film encapsulating layer and a portion of the thin film encapsulating layer is between the protrusion unit and the display unit, wherein the protrusion unit comprises a plurality of support protrusions and a support base supporting the plurality of support protrusions, the display unit further comprises: a pixel electrode coupled to a drain electrode; an opposite electrode facing the pixel electrode;

a light-emitting layer between the pixel electrode and the opposite electrode; a planarization layer between the drain electrode and the pixel electrode; and a pixel defining layer partitioning a region of the light-emitting layer between the pixel electrode and the opposite electrode, wherein the support base comprises a same material and is on a same layer as the planarization layer, and the support protrusion comprises a same material and is on a same layer as the pixel defining layer.

18. A method for manufacturing an organic light-emitting display apparatus, the method comprising:

forming a display unit on substrate;

forming a pad unit at one outer side of the display unit on the substrate;

forming a wiring unit to couple the display unit to the pad unit;

forming a thin film encapsulating layer covering the display unit, the thin film encapsulating layer comprising a stacked structure of a first inorganic layer, a first organic layer and a second inorganic layer, the first organic layer being between the first and second inorganic layers; and forming a protrusion unit on the wiring unit, the protrusion unit overlapping a boundary of the thin film encapsulating layer, wherein the protrusion unit comprises a plurality of support protrusions and a support base supporting the support protrusions, the wiring unit comprises a first wiring layer on the substrate, an insulating layer on the first wiring layer and a second wiring layer on the insulating layer, wherein the support protrusions overlap with the first wiring layer and do not overlap the second wiring layer, the protrusion unit overlays with at least one of a boundary of the first inorganic layer and a boundary of the second inorganic layer of the thin film encapsulating layer and a portion of the thin film encapsulating layer is between the protrusion unit and the display unit.

19. The organic light-emitting display apparatus of claim 1, wherein the protrusion unit extends beyond the at least one of the boundary of the first inorganic layer and the boundary of the second inorganic layer of the thin film encapsulating layer in a direction away from the display unit.

* * * * *